United States Patent [19]

Moeller

[11] 4,136,371

[45] Jan. 23, 1979

[54] MAGNETIC HEAD EMPLOYING HARD AXIS THIN FILM INDUCTOR

[75] Inventor: Charles R. Moeller, Cardiff-by-the-Sea, Calif.

[73] Assignee: Eastman Technology, Inc., Rochester, N.Y.

[21] Appl. No.: 835,105

[22] Filed: Sep. 21, 1977

[51] Int. Cl.² .............................................. G11B 5/34
[52] U.S. Cl. .................................... 360/111; 324/236
[58] Field of Search .............................. 360/111–113, 360/125; 324/43 R, 0.5 R

[56] References Cited

U.S. PATENT DOCUMENTS

| 3,239,754 | 3/1966 | Odom, Jr. et al. | 324/0.5 R |
| 3,829,894 | 8/1974 | Watanabe et al. | 360/111 |

Primary Examiner—John H. Wolff
Attorney, Agent, or Firm—Robert F. Cody

[57] ABSTRACT

A flux-sensitive magnetic head employs, at its back part, a structure having a thin single domain magnetic film coated thereon. A coil wraps around the coated structure, and a direct current is passed through the coil, thereby to apply a hard axis magnetic bias to the film. Signal flux appearing at the head front gap asserts a magnetic force along the hard axis of the film. Contrary to what would be expected, the signal flux causes the inductance of the coil to vary. Such inductance variation may be conveniently detected by (1) connecting the variable inductor into a tank circuit, (2) applying a high frequency ac ripple to the "hard axis" dc bias, and (3) measuring the "hard axis" detuning experienced by the tank circuit.

6 Claims, 7 Drawing Figures

THEORETICAL

EXPERIMENTAL

MAGNETIC HEAD EMPLOYING HARD AXIS THIN FILM INDUCTOR

BACKGROUND OF THE INVENTION

1. Field of the Invention

This invention relates in general to magnetic heads and in particular to magnetic heads of the flux-sensitive type.

2. Description Relative to the Prior Art

The playback of recorded signals from magnetic tape, or the like, using a conventional magnetic head that is sensitive to flux rate-of-change is difficult at low signal frequencies, and theoretically impossible for dc signals, or when there is no relative head-to-tape motion. Various techniques have been proposed for sensing tape flux, as opposed to the rate-of-change of flux (viz Hall effect devices; flux gate devices; etc.). The invention, as will be described below, employs a "single domain" thin magnetic film structure, say, one plated with permalloy to a thickness less than about three microns.

Thin film magnetometers have been described in the literature, and in a number of patents:

"Recent Advances in the Thin Film Inductance Variation Magnetometer", C. J. Bader and C. S. DeRenzi, Intermag, 1947, IEEE;

IEEE Transactions on Magnetics, Vol. Mag-8, #1, March 1972, "Magnetic Thin-film Magnetometers for Magnetic-Field Measurement", H. Irons and L. Schwee;

U.S. Pat. No. 2,856,581, issued in 1958 to L. Alldredge;

U.S. Pat. No. 3,012,177, issued in 1961 to H. Mortimer;

U.S. Pat. No. 3,239,754, issued in 1966 to W. Odom, Jr.; and

U.S. Pat. No. 3,271,665, issued in 1966 to P. Castro.

Of particular interest is the above-noted article by Bader and DeRenzi in which it is stated, categorically, that "variation (of film contributed inductance) with hard axis field ($H_y$) ... with no easy axis field, is zero for all values of $H_y$" (underlining added). Theoretically this may be the case, but it has been found to be incorrect for real films at various values of hard axis field. This fact is used to advantage in apparatus embodying the invention.

SUMMARY OF THE INVENTION

The present invention provides a magnetic head in which the back part thereof is bridged by a thin film structure surrounded by a coil, the hard axis of the film being along the longitudinal axis of the coil. A bias field is applied in the direction of the hard axis (say by passing a direct current through the coil), and an excitation frequency is applied to the coil (causing field variation at such frequency) also in the direction of the hard axis of the film. As signal flux is sensed by the head front gap, it causes the film's hard axis flux to vary accordingly. A circuit responsive to inductance variations of the coil produces a signal corresponding to the sensed signal flux. (Note should be taken that in apparatus according to the invention, (1) signal flux input, (2) bias flux, (3) excitation flux, and (4) the signal output are all associated with the hard axis of the film.) At the heart of the invention is "inductance variation as a function of hard axis field variation". According to the published theory (noted above), the film-contributed inductance variation is zero for all values of hard axis field in the absence of an easy axis field. Perhaps due to acceptance of the published theory, the art has avoided the technique of the invention. Under actual operating conditions, it has been found that the film-contributed inductance of thin magnetic films varies in a continuous manner from an initial value to a maximum and then toward a minimum value as the hard axis field is increased from an initial value of zero. Such inductance variation provides a ready means of producing electrical signals corresponding to the signal flux.

The invention will be further described with reference to the Figures, wherein.

Figure 1:
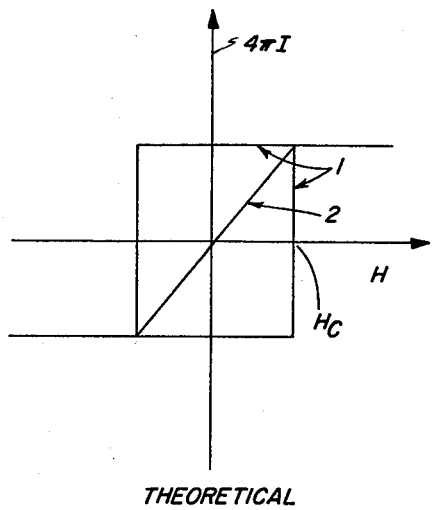
FIGS. 1, 2, 3 and 4 are diagrams useful in describing the invention.

Referring now to FIG. 1, which shows the theoretical saturation loops for both the easy and hard axes for a perfect single domain thin magnetic film: The easy axis loop (curve 1) is square and indicates that a field $H_C$, applied in the easy axis, the magnetization $4\pi I$ switches from one sense to the opposite sense. For example, in the theoretical model, for a thin film coated on a structure of circular cross-section (see FIG. 4), with the film dipole moment oriented in the direction of the arrow B, a field of magnitude $H_C$ will reverse the direction of the film dipole moment. The hard axis loop (FIG. 1, curve 2) is diagonal and indicates that the magnetization $4\pi I$ changes linearly with changes in applied field H. In the theoretical model (see FIG. 4), with a field (arrow C) applied axially in relation to the circumferential film, i.e. applied in the direction of the film hard axis, the film dipole moment reorients in the direction of the field C - in proportion to the strength of field C — until, at the field strength $H_C$, the film moment is parallel to field C. It should be emphasized that the foregoing manifestations are theoretical and apply only to the "perfect" single domain model used.

Figure 3:
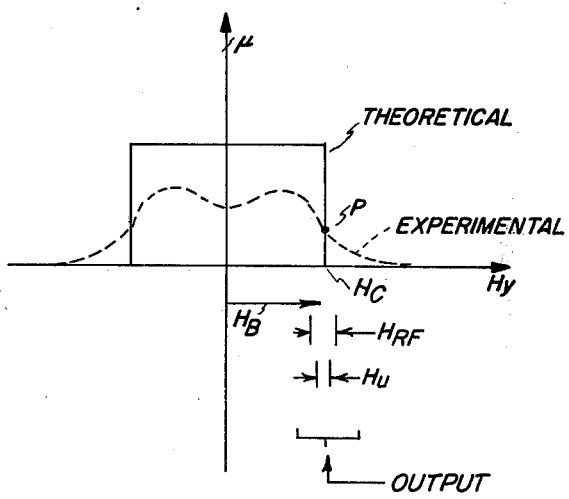
Figure 4:
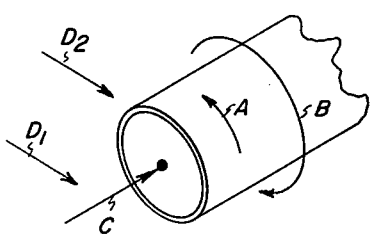

In an actual thin film structure as in FIG. 4, upon which a coil has been wrapped, and in which a hard axis field (arrow C) is applied to the structure, one would expect an inductance vs hard axis field relationship as indicated by the solid line curve of FIG. 3. (This is what was predicted by the model used by Bader and DeRenzi.) That is, with an increasing hard axis field, dB/dH is a constant; thus inductance should remain a constant. Note that permeability $\mu = dB/dH$, i.e. $\mu$ is proportional to the rate of change of the magnetization with respect to the magnetizing field. Inductance is directly related to permeability; hence a variation in permeability produces a consequent variation in inductance.

What was found, however, was that the thin film contributed inductance varied as described previously and as is shown in the dashed-line curve of FIG. 3.

Figure 2:
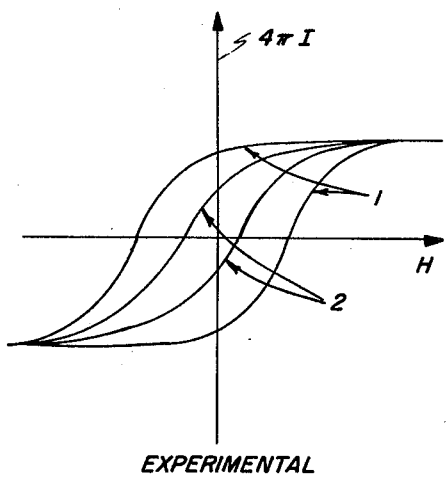

This is explained by the fact that due to dispersion and other unavoidable defects, a "perfect" single domain thin magnetic film is attainable only in theory, and an actual film re-orients in parts, according to the corresponding curves in FIG. 2, at different values of applied field so as to produce a "distribution" type curve instead of the theoretical "step" change at the value $H_C$.

Figure 5:
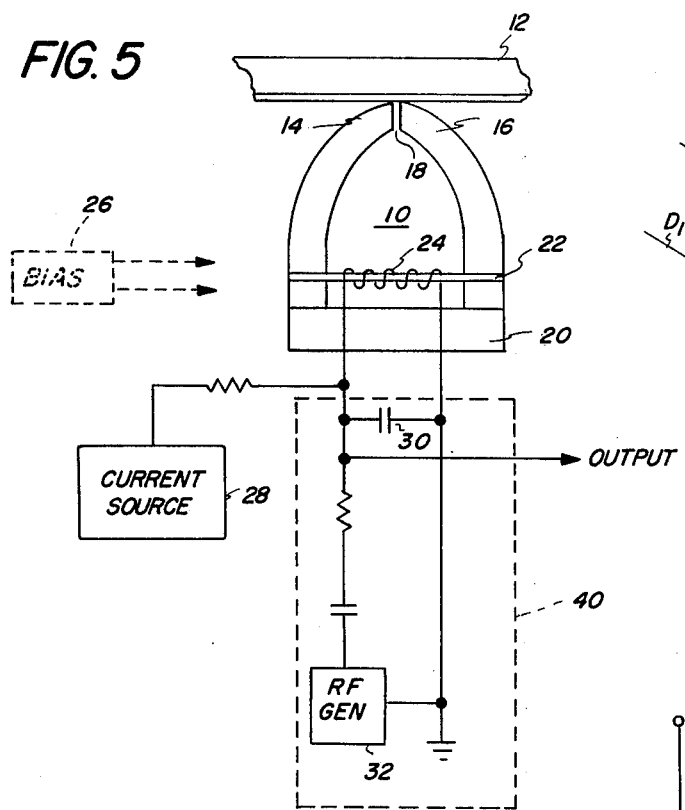
FIG. 5 is a schematic diagram of apparatus embodying the invention.

With the above as background, reference should now be made to FIG. 5 which shows a magnetic head 10 in contact with magnetic tape 12. The head 10 has magnetic pole pieces 14, 16 which define a transducer gap 18, the head being provided with a non-magnetic back bar 20. A thin film structure 22 — say, a wire upon which a thin film was deposited while the wire conducted a current — is connected so as to complete a magnetic circuit from one pole piece to the other. A coil 24 wraps around the film structure 22.

Although a hard axis magnetic bias $H_B$ may be applied to the film structure — say, by a permanent magnet 26 — it has been found convenient to apply a hard axis bias field to the film by passing a direct current (28) through the coil 24. Such a bias establishes a quiescent inductance for the coil as indicated by the point P of FIG. 3.

A capacitor 30 may be connected across the coil 24 forming a tank circuit. The capacitor 30 has a capacitance which may be such that the resonant frequency for the tank circuit is below the frequency of, say, an RF excitation (32) applied to the tank circuit. Thus, in the absence of signal fields ($H_u$) appearing in the head gap 18, the voltage developed across the tank circuit varies at the RF excitation rate . . . this being because the inductance of the coil 24 varies at that rate. As signal flux appears in the head gap 18, however, the inductance of the coil varies in accordance with both the RF excitation and the signal flux, and thus the voltage across the tank circuit appears as an amplitude modulated voltage proportional to the signal flux strength, the modulated voltage being detectable by means known to the art.

It is interesting to note that while 'bias', 'input', 'excitation', and 'output' are all associated with the hard axis of the film, ambient fields perpendicular to the hard axis have negligible influence on the operation of apparatus embodying the invention. This will be evident from FIG. 4, which depicts ambient field vectors $D_{1,2}$: any influence that the field vector $D_1$ has on the film easy axis is equally counteracted by the field vector $D_2$.

Figure 6:
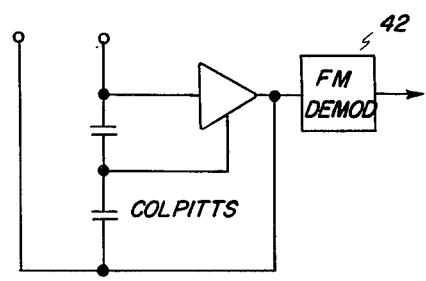
FIG. 6 is a schematic diagram of apparatus useful in practicing the invention.

Although the apparatus of FIG. 5 depicts an arrangement for AM detection of signals corresponding to the signal flux ($H_u$) appearing at the head gap 18, the invention may also be incorporated in other modes of operation, including FM. For example, the structure contained within the dashed lines 40 of FIG. 5 may be replaced by the circuit of FIG. 6. That is, the coil 24 may comprise the inductor, say, of the tank circuit of a Colpitts oscillator, the frequency of which will increase and decrease as a function of the signal flux $H_u$. Such being the case, an FM demodulator 42, adapted to receive the oscillator output, will provide an output voltage proportional to the signal flux $H_u$.

Figure 7:
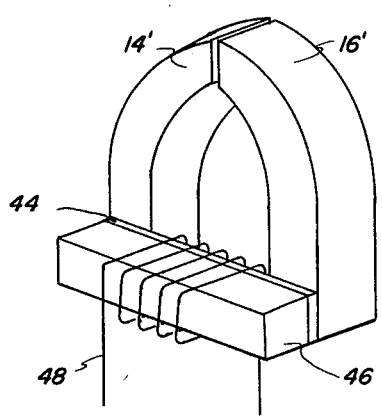
FIG. 7 is a perspective view of another embodiment of the invention.

The invention has been described in detail with particular reference to certain preferred embodiments thereof, but it will be understood that variations and modifications can be effected within the spirit and scope of the invention. For example, although a thin magnetic film coated wire is depicted in FIG. 5, the invention may employ a structure, as depicted in FIG. 7, in which a single domain thin film 44 is deposited on, say, a nonmagnetic planar support 46.

What is claimed is:
1. Magnetic head apparatus comprising:
    (a) first and second magnetic pole pieces disposed to form a transducer gap therebetween;
    (b) means supporting an essentially single domain unidirectional magnetic film magnetically coupled to said pole pieces for completing a magnetic circuit comprising said pole pieces, said gap, and said film, said film being so disposed with respect to said pole pieces that flux entering said transducer gap traverses said film substantially in the direction of the hard axis of said film;
    (c) a coil inductively coupled to the hard axis of said film;
    (d) means for applying a magnetic bias along the hard axis of said film in order to effect a quiescent inductance for said coil, and
    (e) means coupled to said coil for detecting inductance variation thereof as caused by flux variations sensed by said gap,
whereby flux entering said transducer gap correspondingly causes the inductance of said coil to vary detectably.

2. The apparatus of claim 1 wherein said means supporting a magnetic film is an electrically conductive wire having a magnetic film coated thereon, said film being substantially magnetically coupled to said pole pieces.

3. The apparatus of claim 1 including means for applying an excitation field, having an alternating component, substantially in the direction of the coil longitudinal axis.

4. The apparatus of claim 3 including means coupled to said coil for producing a signal corresponding to inductance variations in said coil.

5. The apparatus of claim 4 wherein said means for producing a signal corresponding to inductance variations comprises capacitance means connected to said coil to form therewith a tank circuitry, and means responsive to voltage variations associated with said tank circuit.

6. The apparatus of claim 4 wherein said means for producing a signal corresponding to inductance variations comprises capacitance means connected to said coil to form a tank circuit, amplifier means cooperative with said tank circuit to form therewith an oscillator circuit, and frequency demodulation means cooperative with the oscillator circuit for producing a signal corresponding to frequency variations in said oscillator circuit.

* * * * *